United States Patent
Park et al.

(10) Patent No.: US 8,270,533 B2
(45) Date of Patent: Sep. 18, 2012

(54) TRANSMITTER/RECEIVER AND DATA TRANSMISSION/RECEPTION METHOD IN COMMUNICATION SYSTEM

(75) Inventors: Sung-Ik Park, Daejeon (KR); Hyoungsoo Lim, Daejeon (KR); Heung-Mook Kim, Daejeon (KR); Donghoon Kang, Daejeon (KR); Wangrok Oh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 244 days.

(21) Appl. No.: 12/846,169

(22) Filed: Jul. 29, 2010

(65) Prior Publication Data

US 2011/0103514 A1    May 5, 2011

(30) Foreign Application Priority Data

Oct. 30, 2009   (KR) .................. 10-2009-0104633
May 31, 2010    (KR) .................. 10-2010-0051402

(51) Int. Cl.
*H04L 27/04*     (2006.01)
*H03D 1/24*      (2006.01)

(52) U.S. Cl. ........................................ 375/301; 375/321
(58) Field of Classification Search ............ 375/295, 375/300, 301, 316, 320, 321; 329/356, 357; 332/167, 170
See application file for complete search history.

(56) References Cited

FOREIGN PATENT DOCUMENTS

JP    2008-085921 A    4/2008

*Primary Examiner* — Lawrence B Williams
(74) *Attorney, Agent, or Firm* — Rabin & Berdo, P.C.

(57) ABSTRACT

A transmitter for transmitting data in a communication system includes: a serial/parallel (S/P) conversion unit configured to convert data into an I signal and a Q signal; multiplication units configured to multiply the converted I and Q signals by orthogonal sequences, respectively; conversion units configured to Hilbert-transform the I and Q signals multiplied by the orthogonal sequences; addition units configured to add the I and Q signals multiplied by the orthogonal sequences and the Hilbert-transformed Q and I signal, respectively; and an intermediate frequency (IF)/radio frequency (RF) unit configured to up-convert the added I signal and the added Q signal and transmit the converted I and Q signals.

20 Claims, 4 Drawing Sheets

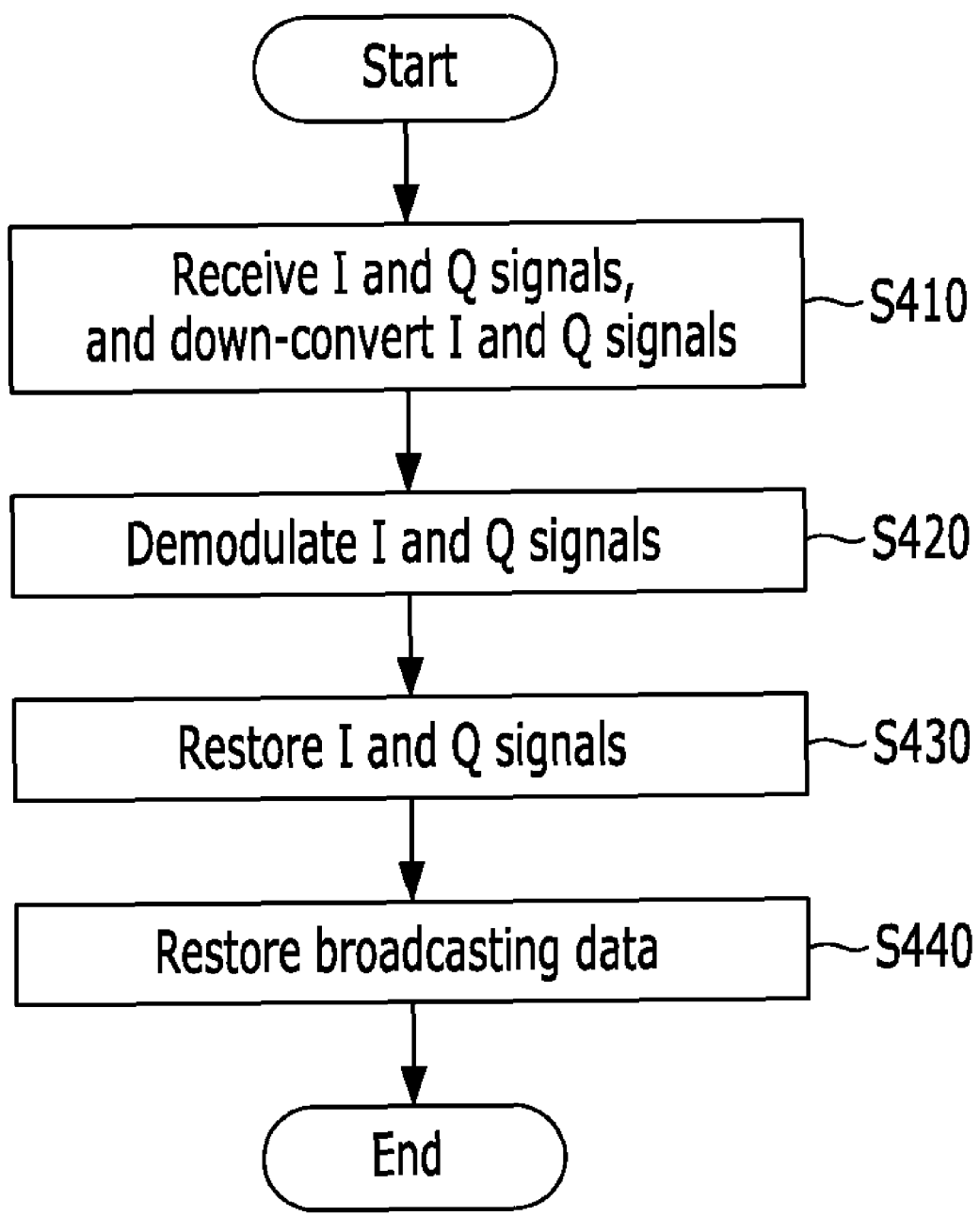

TRANSMITTER/RECEIVER AND DATA TRANSMISSION/RECEPTION METHOD IN COMMUNICATION SYSTEM

CROSS-REFERENCE(S) TO RELATED APPLICATIONS

The present application claims priority of Korean Patent Application Nos. 10-2009-0104633 and 10-2010-0051402, filed on Oct. 30, 2009, and May 31, 2010, respectively, which are incorporated herein by reference in their entirety.

BACKGROUND OF THE INVENTION

1. Field of the Invention

Exemplary embodiments of the present invention relate to a communication system; and, more particularly, to a transmitter/receiver and a data transmission/reception method in a communication system, which transmit and receive complex signals of broadcasting data by using a vestigial sideband (VSB)/single sideband (SSB) modulation scheme.

2. Description of Related Art

In a next-generation communication system, much research is being actively conducted to provide services having various qualities of service (QoS) at high transmission rates. A digital broadcasting system may be taken as an example of the next-generation communication system, and a variety of methods have been proposed to quickly transmit various forms of image and voice data through limited resources. In other words, a variety of methods have been proposed to improve transmission efficiency of broadcasting data including various forms of image and voice data in the digital broadcasting system. In particular, methods for transmitting and receiving broadcasting data by using the VSB/SSB modulation scheme have been proposed to improve transmission efficiency per unit frequency in a double sideband (DSB) modulation scheme.

Meanwhile, when a current digital broadcasting system transmits broadcasting data by using the above-described VSB/SSB modulation scheme, the digital broadcasting system removes an SSB frequency component corresponding to redundancy among DSB frequency components of a real signal from the broadcasting data, and then transmits the broadcasting data. Therefore, it is difficult for the current digital broadcasting system to transmit complex signals composing broadcasting data, for example, in-phase (I) signals and quadrature-phase (Q) signals by using the VSB/SSB modulation scheme.

In other words, when the digital broadcasting system transmits broadcasting data composed of complex signals by using the VSB/SSB modulation scheme to improve the transmission efficiency per unit frequency, the digital broadcasting system removes Q signals from the complex signals of the broadcasting data, and transmits broadcasting data composed of only I signals. Since the broadcasting data composed of only I signals are transmitted, broadcasting data different from the broadcasting data composed of complex signals are transmitted and received. That is, since the digital broadcasting system does not transmit and receive broadcasting data including I/Q signals, but transmits and receives broadcasting data including only I signals, there is a limit to providing high-quality digital broadcasting to users.

Therefore, there is a demand for a method which transmits and receives complex signals composing broadcasting data by using the VSS/SSB modulation scheme to improve the transmission efficiency per unit frequency in a communication system, for example, a digital broadcasting system.

SUMMARY OF THE INVENTION

An embodiment of the present invention is directed to a transmitter/receiver and a data transmission/reception method in a communication system.

Another embodiment of the present invention is directed to a transmitter/receiver and a data transmission/reception method in a communication system, which transmit and receive complex signals of broadcasting data.

Another embodiment of the present invention is directed to a transmitter/receiver and a data transmission/reception method in a communication system, which transmit and receive complex signals of broadcasting data by using the VSB/SSB modulation scheme.

Another embodiment of the present invention is directed to a transmitter/receiver and a data transmission/reception method in a communication system, which improve transmission efficiency per unit frequency by using the VSB/SSB modulation scheme and transmit and receive I and Q signals to provide high-quality digital broadcasting.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In accordance with an embodiment of the present invention, a transmitter for transmitting data in a communication system includes: a serial/parallel (S/P) conversion unit configured to convert data into an I signal and a Q signal; multiplication units configured to multiply the converted I and Q signals by orthogonal sequences, respectively; conversion units configured to Hilbert-transform the I and Q signals multiplied by the orthogonal sequences; addition units configured to add the I and Q signals multiplied by the orthogonal sequences and the Hilbert-transformed Q and I signal, respectively; and an intermediate frequency (IF)/radio frequency (RF) unit configured to up-convert the added I signal and the added Q signal and transmit the converted I and Q signals.

In accordance with another embodiment of the present invention, a receiver for receiving data in a communication system includes: an RF/IF unit configured to receive I and Q signals of data and down-convert the received I and Q signals; conversion units configured to Hilbert-transform the down-converted I and Q signals; addition units configured to add the down-converted I and Q signals and the Hilbert-transformed Q and I signals, respectively; multiplication units configured to multiply the added I signal and the added Q signal by orthogonal sequences, respectively; and a P/S conversion unit configured to convert the I and Q signals multiplied by the orthogonal sequences and restore the data.

In accordance with another embodiment of the present invention, a data transmission method in a communication system includes: converting serial data into parallel I and Q signals, and orthogonalizing the I and Q signals by multiplying the converted I and Q signals by orthogonal Hadamard sequences, respectively; modulating the orthogonalized I and Q signals through a VSB/SSB modulation scheme; and up-converting the modulated I and Q signals from a baseband into IF and RF bands, and transmitting the converted I and Q signals.

In accordance with another embodiment of the present invention, a data reception method in a communication system includes: receiving I and Q signals of data, and down-converting the received I and Q signals from RF and IF bands into a baseband; demodulating the down-converted I and Q signals through a demodulation scheme corresponding to a VSB/SSB modulation scheme; multiplying the demodulated I and Q signals by orthogonal Hadamard sequences, respectively, to restore the I and Q signals of the data; and converting the restored I and Q signals from a parallel form into a serial form to restore the data.

BRIEF DESCRIPTION OF THE DRAWINGS

FIG. 4 is a flow chart explaining a reception operation of the receiver in the communication system in accordance with the embodiment of the present invention.

DESCRIPTION OF SPECIFIC EMBODIMENTS

Figure 1:
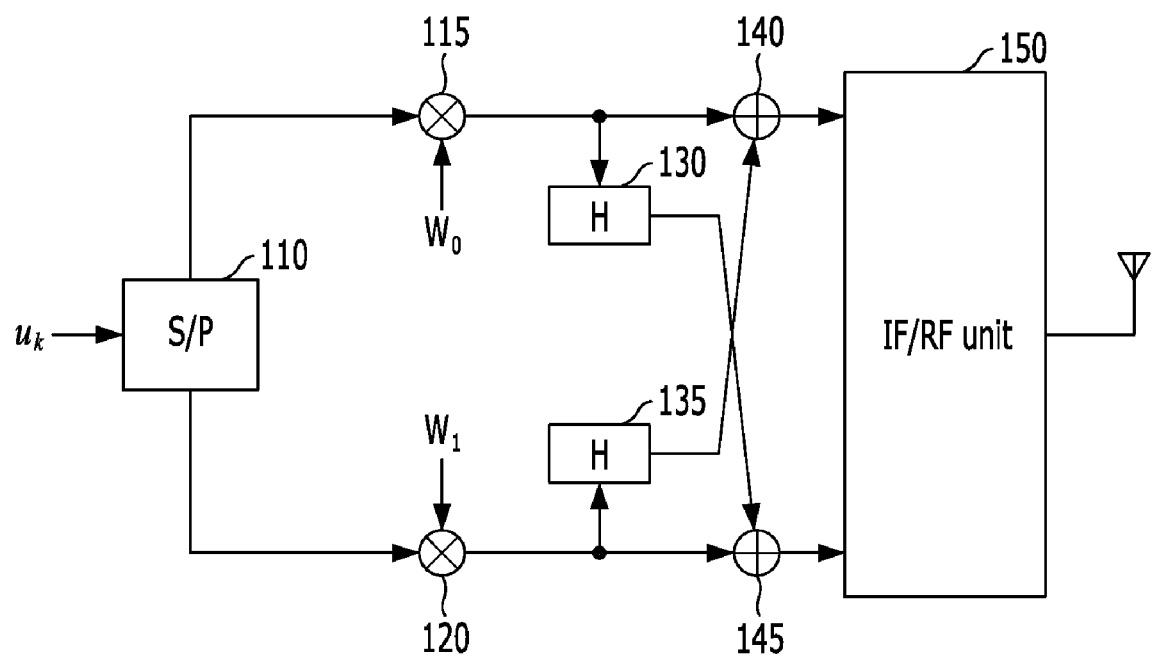
FIG. 1 is a diagram schematically illustrating the structure of a transmitter in a communication system in accordance with an embodiment of the present invention.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Exemplary embodiments of the present invention provide a transmitter/receiver and a data transmission/reception method in a communication system in a communication system, for example a digital broadcasting system. In the embodiments of the present invention, a digital broadcasting system transmits and receives broadcasting data by using the VSB/SSB modulation scheme to make the most of limited resources, that is, to maximize transmission efficiency per unit frequency. At this time, the digital broadcasting system in accordance with the embodiments of the present invention transmits and receives complex signals composing the broadcasting data, that is, I and Q signals by using the VSB/SSB modulation scheme. In the embodiments of the present invention, the descriptions will be focused on the transmitter/receiver and the data transmission/reception method using the VSB/SSB modulation scheme in the digital broadcasting system. However, the transmitter/receiver and the data transmission/reception method in accordance with the embodiments of the present invention may be applied to other communication systems. Furthermore, the transmitter/receiver and the data transmission/reception method may be applied to a case in which data are transmitted and received by using another modulation scheme without using the VSB/SSB modulation scheme.

Referring to FIG. 1, a transmitter in a communication system in accordance with an embodiment of the present invention will be described specifically.

FIG. 1 is a diagram schematically illustrating the structure of the transmitter in the communication system in accordance with the embodiment of the present invention.

Referring to FIG. 1, the transmitter includes a serial/parallel (S/P) conversion unit 110, multiplication units 115 and 120, conversion units 130 and 135, addition units 140 and 145, and an intermediate frequency (IF)/radio frequency (RF) unit 150. The S/P conversion unit 110 is configured to convert broadcasting data $u_k$ inputted in a serial form into a parallel form. The multiplication units 115 and 120 are configured to multiply the output data of the S/P converter 110 by predetermined sequences. The conversion units 130 and 135 are configured to convert the output data of the multiplication units 115 and 120 through a predetermined scheme. The addition units 140 and 145 are configured to add the output data of the conversion units 130 and 135 and the output data of the multiplication units 115 and 120. The IF/RF unit 150 is configured to convert the output data of the addition units 140 and 145 from a baseband into IF and RF bands, and transmit the converted data through an antenna.

The S/P conversion unit 110 converts the broadcasting data $u_k$ inputted in a serial form into a parallel form. At this time, the broadcasting data $u_k$ is converted into an I signal and a Q signal by the S/P conversion unit 110. In other words, the S/P conversion unit 110 converts the broadcasting data $u_k$, which is composed of complex signals, that is, the I signal and the Q signal and inputted in a serial form, into the I signal and the Q signal. The I signal and the Q signal are inputted to the corresponding paths, that is, the first multiplication unit 115 and the second multiplication unit 120, respectively. At this time, the I signal of the broadcasting data $u_k$ is transmitted to the data path of the I signal by the S/P conversion unit 110, and the Q signal of the broadcasting data $u_k$ is transmitted to the data path of the Q signal by the S/P conversion unit 110. The data path of the I signal includes the first multiplication unit 115, the first conversion unit 130, and the first addition unit 140, and the data path of the Q signal includes the second multiplication unit 120, the second conversion unit 135, and the second addition unit 145.

The first and second multiplication units 115 and 120 multiply the I and Q signals by orthogonal sequences, respectively. For example, the first and second multiplication units 115 and 120 multiply the I and Q signals by Hadamard sequences $W_0$ and $W_1$, respectively. The Hadamard sequences $W_0$ and $W_1$ have a length of 2 or N, and may be expressed as Equation 1 below.

$$\begin{bmatrix} W_0 \\ W_1 \end{bmatrix} = \begin{bmatrix} +1 & +1 \\ +1 & -1 \end{bmatrix} \qquad \text{Eq. 1}$$

Between the Hadamard sequences $W_0$ and $W_1$ having an orthogonal relationship to each other, the first Hadamard sequence $W_0$ is inputted to the first multiplication unit 115 and then multiplied by the I signal, and the second Hadamard sequence $W_1$ is inputted to the second multiplication unit 120 and then multiplied by the Q signal. That is, the first multiplication unit 115 receives and multiplies the first Hadamard sequence $W_0$ and the I signal, and the second multiplication unit 120 receives and multiplies the second Hadamard sequence $W_1$ and the Q signal. Accordingly, the I and Q signals multiplied by the orthogonal sequences, respectively, have an orthogonal relationship. The I and Q signals, which are multiplied by the Hadamard sequences $W_0$ and $W_1$ by the first and second multiplication units 115 and 120, respectively, and have an orthogonal relationship, that is, the orthogonalized I and Q signals are inputted to the first and second conversion units 130 and 135 and the first and second addition units 140 and 145, respectively.

The first and second conversion units 130 and 135 converts the I and Q signals multiplied by the Hadamard sequences $W_0$ and $W_1$ through a predetermined scheme, for example, the Hilbert transform. The first conversion unit 130 Hilbert-transform the signal outputted from the first multiplication unit 115, that is, the I signal multiplied by the first Hadamard sequence $W_0$, and then outputs the Hilbert-transformed I signal to the data path of the Q signal. The second conversion unit 135 Hilbert-transforms the signal outputted from the second multiplication unit 120, that is, the Q signal multiplied by the second Hadamard sequence $W_1$, and then outputs the Hilbert-transformed Q signal to the data path of the I signal. That is, the Hilbert-transformed I signal is inputted to the second addition unit 145, and the Hilbert-transformed Q signal is inputted to the first addition unit 140. The Hilbert-transformed I and Q signals have an orthogonal relationship to each other, because the I and Q signals multiplied by the Hadamard sequences $W_0$ and $W_1$ which are orthogonal sequences are Hilbert-transformed.

The addition units 140 and 145 add the I and Q signals multiplied by the Hadamard sequences $W_0$ and $W_1$ and the Hilbert-transformed Q and I signals, respectively. The first addition unit 140 adds the I signal multiplied by the first Hadamard sequence $W_0$ and the Hilbert-transformed Q signal. At this time, the I signal multiplied by the first Hadamard sequence $W_0$ and the Hilbert-transformed Q signal have an orthogonal relationship to each other. The second addition unit 145 adds the Q signal multiplied by the second Hadamard sequence $W_1$ and the Hilbert-transformed I signal. At this time, the Q signal multiplied by the second Hadamard sequence $W_1$ and the Hilbert-transformed I signal have an orthogonal relationship to each other. As described above, the first and second addition units 140 and 145 add the I and Q signals multiplied by the Hadamard sequences $W_0$ and $W_1$ and the Hilbert-transformed Q and I signals, respectively, and output the added I signal and the added Q signal to the IF/RF unit 150 as the data modulated through the VSB/SSB modulation scheme.

As described above, the I and Q signals, which are inputted to the S/P conversion unit 110 and compose the broadcasting data $u_k$, are multiplied by the orthogonal sequences, that is, the Hadamard sequences $W_0$ and $W_1$ by the multiplication units 115 and 120. The I and Q signals multiplied by the Hadamard sequences $W_0$ and $W_1$ may be expressed as $x_k^I$ and $x_k^Q$, respectively. Furthermore, the addition units 140 and 145 add the I and Q signals multiplied by the Hadamard sequences $W_0$ and $W_1$ and the Hilbert-transformed Q and I signals, respectively. The added I signal and the added Q signal may be expressed as $x_k^I - \hat{x}_k^Q$ and $x_k^Q + \hat{x}_k^I$, respectively. That is, the first multiplication unit 115 outputs the I signal $x_k^I$ obtained by multiplying the I signal by the first Hadamard sequence $W_0$, and the second multiplication unit 120 outputs the Q signal $x_k^Q$ obtained by multiplying the Q signal by the second Hadamard sequence $W_1$. Furthermore, the first addition unit 140 outputs the I signal $x_k^I - \hat{x}_k^Q$ obtained by adding the I signal $x_k^I$ and the Hilbert-transformed Q signal $-\hat{x}_k^Q$, and the second addition unit 145 outputs the Q signal $x_k^Q + \hat{x}_k^I$ obtained by adding the Q signal $x_k^Q$ and the Hilbert-transformed I signal $\hat{x}_k^I$.

As described above, the I and Q signals $x_k^I$ and $x_k^Q$ obtained by multiplying the I and Q signals by the Hadamard sequences $W_0$ and $W_1$, respectively, have an orthogonal relationship, and the I and Q signals $x_k^I - \hat{x}_k^Q$ and $x_k^Q + \hat{x}_k^I$ obtained by adding the I and Q signals $x_k^I$ and $x_k^Q$ and the Hilbert-transformed Q and I signals $-\hat{x}_k^Q$ and $\hat{x}_k^I$, respectively, have an orthogonal relationship.

The IF/RF unit 150 up-converts the inputted I and Q signals, that is, the broadcasting data modulated by the VSB/SSB modulation scheme from a baseband into IF and RF bands, and then transmits the converted broadcasting data to a receiver through an antenna. The broadcasting data transmitted to the receiver through the antenna includes the I and Q signals which are all modulated by the VSB/SSB modulation scheme. In other words, the broadcasting data includes the complex signals modulated by the VSB/SSB modulation scheme. As described above, the I and Q signals modulated by the VSB/SSB modulation scheme have an orthogonal relationship to each other. The I signal modulated by the VSB/SSB modulation scheme may be expressed as $x_k^I - x_k^Q$, and the Q signal modulated by the VSB/SSB modulation scheme may be expressed as $x_k^Q + \hat{x}_k^I$.

The transmitter in accordance with the embodiment of the present invention uses the S/P conversion unit 110, the multiplication units 115 and 120, the conversion units 130 and 135, and the addition units 140 and 145 to modulate both the I and Q signals of the broadcasting data $u_k$ through the VSB/SSB modulation scheme, and then transmits the modulated I and Q signals. Through the VSB/SSB modulation scheme, the transmission efficiency per unit frequency may be maximized. Furthermore, since the I and Q signals modulated through the VSB/SSB modulation scheme are transmitted to the receiver, it is possible to provide high-quality digital broadcasting.

Figure 2:
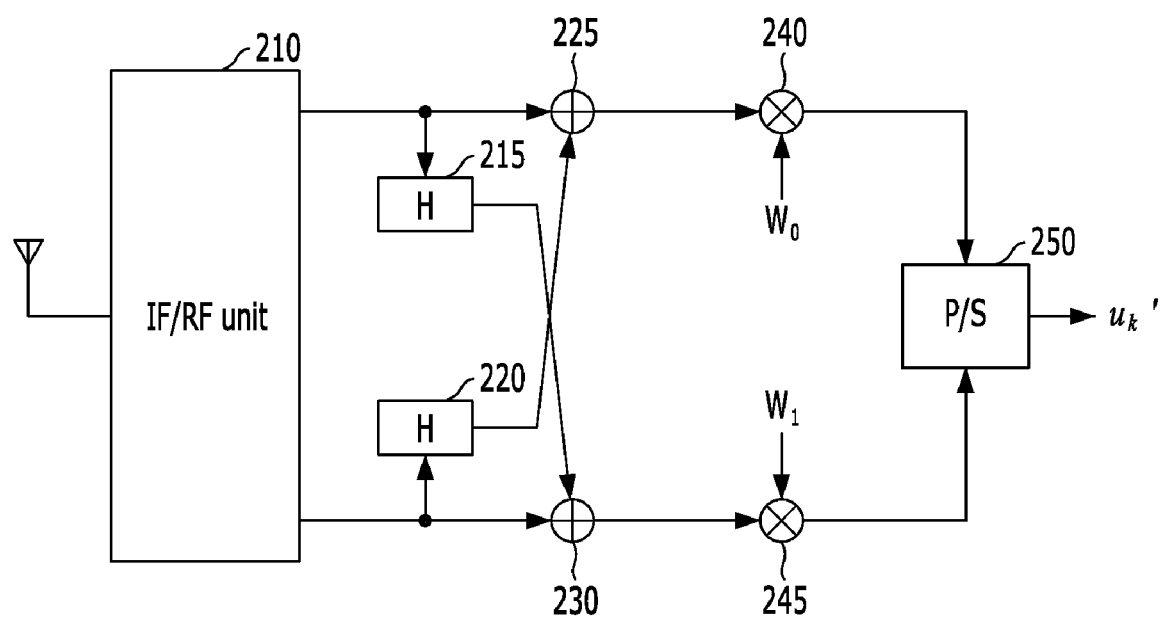
FIG. 2 is a diagram schematically illustrating the structure of a receiver in a communication system in accordance with another embodiment of the present invention.

FIG. 2 is a diagram schematically illustrating the structure of a receiver in the communication system in accordance with another embodiment of the present invention.

Referring to FIG. 2, the receiver includes an RF/IF unit 210, conversion units 215 and 220, addition units 225 and 230, multiplication units 240 and 245, and a P/S conversion unit 250. The RF/IF unit 210 is configured to receive broadcasting data transmitted by the transmitter through an antenna, and convert the broadcasting data from RF and IF bands to a baseband. The conversion units 215 and 220 are configured to convert the baseband broadcasting data outputted from the RF/IF unit 210 through a predetermined scheme. The addition units 225 and 230 are configured to add the output data of the conversion units 215 and 220 and the output data of the RF/IF unit 210. The multiplication units 240 and 245 are configured to multiply the output data of the addition units 225 and 230 by predetermined sequences. The P/S conversion unit 250 is configured to convert the output data of the multiplication units 240 and 245 into a serial form, and output the restored broadcasting data $u_k'$.

The RF/IF unit 210 receives the I and Q signals modulated through the VSS/SSB modulation scheme, that is, the broadcasting data composed of complex signals through the antenna, and down-converts the broadcasting data composed of complex signals from the RF and IF bands to the baseband. As described above, when the transmitter modulates the I and Q signals composing the broadcasting data through the VSS/SSB modulation scheme, the I and Q signals are multiplied by orthogonal sequences, for example, Hadamard sequences $W_0$ and $W_1$. Therefore, the I and Q signals of the broadcasting data which are modulated through the VSB/SSB modulation scheme and inputted to the RF/IF unit 210 through the antenna have an orthogonal relationship to each other. The I signal of the broadcasting data inputted to the RF/IF unit 210 is transmitted to a data path of the I signal, and the Q signal of the broadcasting data inputted to the RF/IF unit 210 is transmitted to a data path of the Q signal. The data path of the I signal includes the third conversion unit 215, the third addition unit 225, and the third multiplication unit 240, and the data path of the Q signal includes the fourth conversion unit 220, the fourth addition unit 230, and the fourth multiplication unit 245.

That is, the I signal of the broadcasting data outputted from the RF/IF unit 210 is inputted to the third conversion unit 215 and the third addition unit 225 as the I signal modulated through the VSB/SSB modulation scheme, and the Q signal of the broadcasting data outputted from the RF/IF unit 210 is inputted to the fourth conversion unit 220 and the fourth addition unit 230 as the Q signal modulated through the VSB/SSB modulation scheme. When the transmitter transmits the I and Q signals modulated through the VSB/SSB modulation scheme, the I signal modulated through the VSB/SSB modulation scheme may be expressed as $x_k^I - \hat{x}_k^Q$, and the Q signal modulated through the VSB/SSB modulation scheme may be expressed as $x_k^Q + \hat{x}_k^I$.

The conversion units 215 and 220 convert the I and Q signals modulated by the VSB/SSB modulation scheme through a predetermined scheme, for example, the Hilbert-transform performed in the transmitter. The third conversion unit 215 Hilbert-transforms the I signal modulated through the VSB/SSB modulation scheme and outputted from the RF/IF unit 210, and then outputs the Hilbert-transformed I signal to the data path of the Q signal. The fourth conversion unit 220 Hilbert-transforms the Q signal modulated through the VSB/SSB modulation scheme and outputted from the RF/IF unit 210, and then outputs the Hilbert-transformed Q signal to the data path of the I signal. That is, the Hilbert-transformed I signal is inputted to the fourth addition unit 230, and the Hilbert-transformed Q signal is inputted to the third addition unit 225. The Hilbert-transformed I and Q signals have an orthogonal relationship to each other, because the orthogonal I and Q signals modulated through the VSB/SSB modulation scheme are Hilbert-transformed.

As described above, when the I signal modulated through the VSB/SSB modulation scheme is expressed as $x_k^I - x_k^Q$ and the Q signal modulated through the VSB/SSB modulation scheme is expressed as $x_k^Q + x_k^I$, the components of the I signal, for example, $x_k^I$ and $\hat{x}_k^I$ and the components of the Q signal, for example, $x_k^Q$ and $-\hat{x}_k^Q$, respectively, may be separated from each other, because the I signal $x_k^I - \hat{x}_k^Q$ and the Q signal $x_k^Q + \hat{x}_k^I$ have an orthogonal relationship. The separated components of the I and Q signals are used to perform the Hilbert transform. The Hilbert-transformed I signal may be expressed as $\hat{x}_k^I$, and the Hilbert-transformed Q signal may be expressed as $-\hat{x}_k^Q$.

The addition units 225 and 230 add the I and Q signals modulated through the VSB/SSB modulation scheme and the Hilbert-transformed Q and I signals, respectively. The third addition unit 225 adds the I signal modulated through the VSB/SSB modulation scheme and the Hilbert-transformed Q signal. At this time, the I signal modulated through the VSB/SSB modulation scheme and the Hilbert-transformed Q signal have an orthogonal relationship to each other. The fourth addition unit 230 adds the Q signal modulated through the VSB/SSB modulation scheme and the Hilbert-transformed I signal. At this time, the Q signal modulated through the VSB/SSB modulation scheme and the Hilbert-transformed I signal have an orthogonal relationship to each other.

As described above, when the I signal modulated through the VSB/SSB modulation scheme is expressed as $x_k^I - \hat{x}_k^Q$ and the Q signal modulated through the VSB/SSB modulation scheme is expressed as $x_k^Q + \hat{x}_k^I$, the third addition unit 225 adds the I signal $x_k^I - \hat{x}_k^Q$ and the Hilbert-transformed Q signal $-\hat{x}_k^Q$ and then outputs the obtained I signal $x_k^I$ to the third multiplication unit 240, and the fourth addition unit 230 adds the Q signal $x_k^Q + \hat{x}_k^I$ and the Hilbert-transformed I signal $\hat{x}_k^I$ and then outputs the obtained Q signal $x_k^Q$ to the fourth multiplication unit 245. The added I signal $x_k^I$ and the added Q signal $x_k^Q$ have an orthogonal relationship to each other.

The multiplication units 240 and 245 multiply the I and Q signals outputted from the addition units 225 and 230 by orthogonal sequences, respectively. For example, the Hadamard sequences $W_0$ and $W_1$ multiplied in the transmitter may be applied. As described above, the Hadamard sequences $W_0$ and $W_1$ are Hadamard sequences having a length of 2 or N, and may be expressed as Equation 1. The Hadamard sequences $W_0$ and $W_1$ have an orthogonal relationship to each other. The first Hadamard sequence $W_0$ is inputted to the third multiplication unit 230 and then multiplied by the added I signal. The second Hadamard sequence $W_1$ is inputted to the fourth multiplication unit 245 and then multiplied by the added Q signal. That is, the third multiplication unit 240 receives and multiplies the first Hadamard sequence $W_0$ and the added I signal $x_k^I$, and the fourth multiplication unit 245 receives and multiplies the second Hadamard sequence $W_1$ and the added Q signal $x_k^Q$. The I and Q signals multiplied by the Hadamard sequence $W_0$ and $W_1$ by the third and fourth multiplication units 240 and 245, respectively, have an orthogonal relationship to each other and are inputted to the P/S conversion unit 250.

The P/S conversion unit 250 converts the I and Q signals inputted in a parallel form into serial broadcasting data $u_k'$, and outputs the restored broadcasting data $u_k'$. Accordingly, the receiver in accordance with the embodiment of the present invention receives the broadcasting data modulated through the VSB/SSB modulation scheme from the transmitter, restores the I and Q signals through the demodulation scheme corresponding to the VSB/SSB modulation scheme, and outputs the broadcasting data composed of complex signals. That is, the transmitter and receiver in accordance with the embodiment of the present invention transmit and receive the broadcasting data by applying the VSB/SSB modulation scheme. Therefore, the data transmission efficiency per unit frequency may be maximized to increase the resource use efficiency. Furthermore, since the transmitter and receiver transmit and receive all the complex signals composing the broadcasting data, that is, the I and Q signals, it is possible to provide high-quality digital broadcasting to users.

Figure 3:
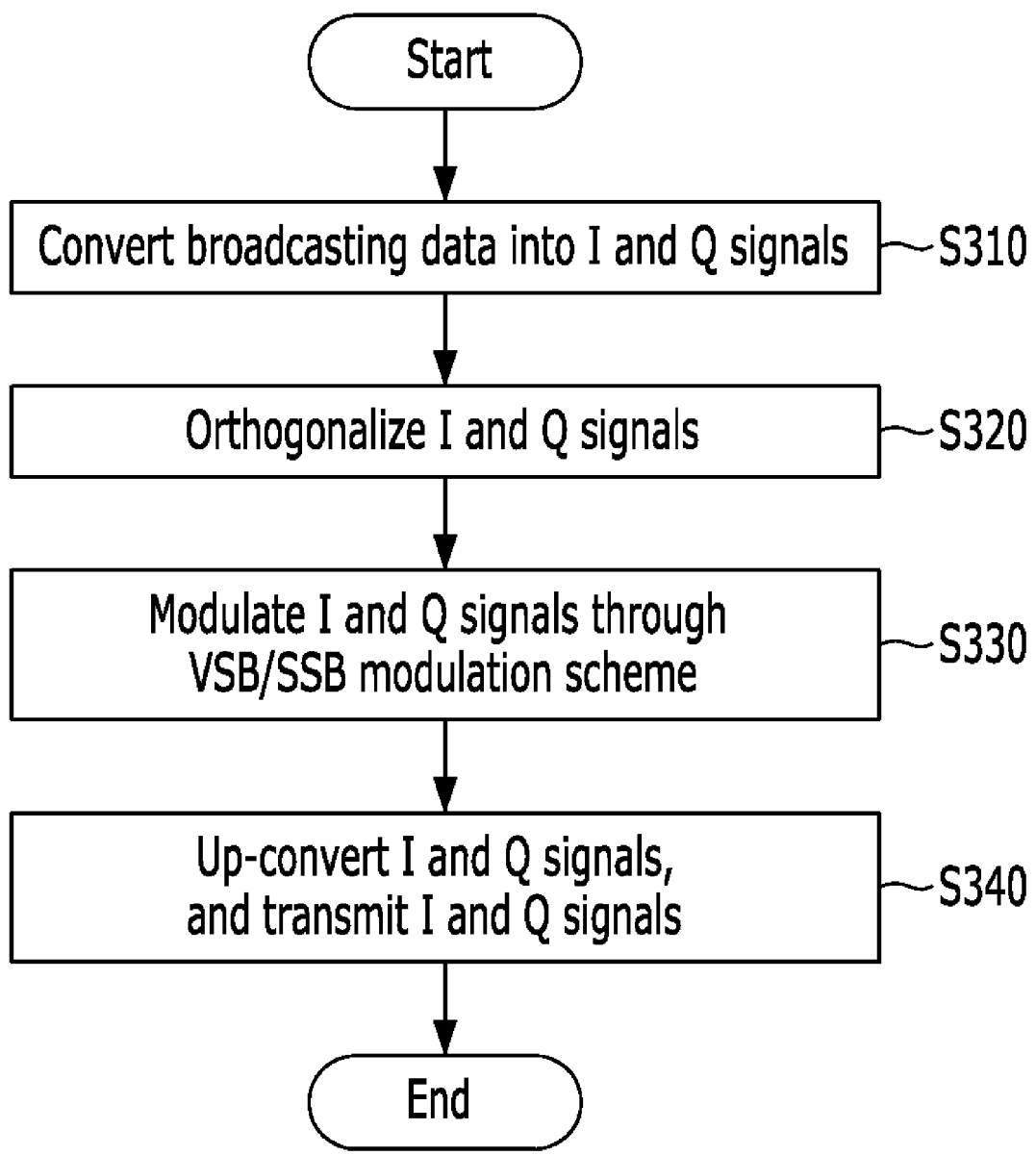
FIG. 3 is a flow chart explaining a transmission operation of the transmitter in the communication system in accordance with the embodiment of the present invention.

Referring to FIG. 3, the transmission operation of broadcasting data modulated through the VSB/SSB modulation scheme in the communication system in accordance with the embodiment of the present invention will be described in detail.

FIG. 3 is a flow chart explaining the transmission operation of the transmitter in the communication system in accordance with the embodiment of the present invention.

Referring to FIG. 3, the transmitter converts broadcasting data inputted in a serial form into parallel I and Q signals in a step S310. The broadcasting data includes the I and Q signals as complex signals. The transmitter converts the broadcasting data into the I and Q signals such that the VSB/SSB modulation scheme may be applied to both the I and Q signals.

In a step S320, the transmitter multiplies the converted I and Q signals by predetermined sequences to orthogonalize the I and Q signals. As described above, the I and Q signals are multiplied by orthogonal sequences as the predetermined sequences, for example, the Hadamard sequences, respectively. At this time, the I signal is multiplied by the first Hadamard sequence, and the Q signal is multiplied by the second Hadamard sequence. The Hadamard sequences may be expressed as Equation 1. As the Hadamard sequences having an orthogonal relationship are multiplied by the I and Q signals, respectively, the I and Q signals have an orthogonal relationship to each other.

In a step S330, the transmitter converts the orthogonalized I and Q signals through a predetermined scheme, for example, the Hilbert transform, and adds the orthogonalized I and Q signals and the Hilbert-transformed Q and I signals, respectively. That is, the transmitter performs modulation through the VSB/SSB modulation scheme. At this time, as the Hilbert-transformed I signal and the orthogonalized Q signal are added, the Q signal of the broadcasting data is modulated through the VSB/SSB modulation scheme. As the Hilbert-transformed Q signal and the orthogonalized I signal are added, the I signal of the broadcasting data is modulated through the VSB/SSB modulation scheme. As described above, the I and Q signals modulated through the VSB/SSB modulation scheme have an orthogonal relationship to each other, because the I and Q signals are multiplied by orthogonal sequences, respectively.

In a step S340, the transmitter converts the I and Q signals modulated through the VSB/SSB modulation scheme from a baseband into IF and RF bands. That is, the transmitter up-converts the I and Q signals in the baseband, and then transmits the converted I and Q signals through the antenna. As described above, the broadcasting data transmitted to the receiver through the antenna includes the I and Q signals modulated through the VSB/SSB modulation scheme, and the I and Q signals modulated through the VSB/SSB modulation scheme have an orthogonal relationship to each other. Furthermore, when transmitting the broadcasting data, the transmitter applies the VSB/SSB modulation scheme to maximize the data transmission rate for unit frequency. Furthermore, since the transmitter transmits the broadcasting data including the I and Q signals, it is possible to provide high-quality digital broadcasting.

Referring to FIG. 4, the reception operation of the broadcasting data to which the VSB/SSB modulation scheme is applied in accordance with the embodiment of the present invention will be described in detail.

FIG. 4 is a flow chart explaining the reception operation of the receiver in the communication system in accordance with the embodiment of the present invention.

Referring to FIG. 4, the receiver receives the I and Q signals modulated through the VSB/SSB modulation scheme, and down-converts the received I and Q signals from IF and RF bands into a baseband in a step S410.

In a step S420, the receiver demodulates the baseband I and Q signals modulated through the VSB/SSB modulation scheme, through a demodulation scheme corresponding to the VSB/SSB modulation scheme of the transmitter which transmits the broadcasting data by applying the VSB/SSB modulation scheme. That is, the receiver demodulates the down-converted I and Q signals through the demodulation scheme corresponding to the VSB/SSB modulation scheme. The baseband I and Q signals modulated through the VSB/SSB modulation scheme are converted through a predetermined scheme. For example, the I and Q signals may be Hilbert-transformed in correspondence to the Hilbert transform of the transmitter. The Hilbert-transformed Q and I signals are added to the baseband I and Q signals modulated through the VSB/SSB modulation scheme, respectively.

As the Hilbert-transformed I signal is added to the baseband Q signal modulated through the VSB/SSB modulation scheme, the down-converted Q signal becomes the Q signal demodulated in correspondence to the VSB/SSB modulation scheme. As the Hilbert-transformed Q signal is added to the baseband I signal modulated through the VSB/SSB modulation scheme, the down-converted I signal becomes the I signal demodulated in correspondence to the VSB/SSB modulation scheme. Since the I and Q signals which are modulated through the VSB/SSB modulation scheme and received from the transmitter have an orthogonal relationship as described above, the I and Q signals may be easily separated by the receiver. Furthermore, the Hilbert transform using the separated I and Q signals may be easily performed, and the demodulation of the I and Q signals may be easily performed through the Hilbert transform.

In a step S430, the receiver multiplies the demodulated I and Q signals by predetermined sequences to restore the I and Q signals of the broadcasting data received from the transmitter. At this time, the I and Q signals are multiplied by the Hadamard sequences as the predetermined sequences, respectively, which are orthogonal sequences. Specifically, the I signal is multiplied by the first Hadamard sequence, and the Q signal is multiplied by the second Hadamard sequence. At this time, since the I and Q signals have an orthogonal relationship, the receiver may easily restore the I and Q signals.

In a step S440, the receiver converts the parallel I and Q signals into a serial form to restore the broadcasting data received from the transmitter. As described above, the broadcasting data received from the transmitter is transmitted by applying the VSB/SSB modulation scheme. Therefore, the data transmission rate per unit frequency may be maximized. As both the I and Q signals modulated through the VSB/SSB modulation scheme are received, both the I and Q signals may be restored to provide high-quality digital broadcasting to users.

While the present invention has been described with respect to the specific embodiments, it will be apparent to those skilled in the art that various changes and modifications may be made without departing from the spirit and scope of the invention as defined in the following claims.

What is claimed is:

1. A transmitter for transmitting data in a communication system, comprising:
   a serial/parallel (S/P) conversion unit configured to convert data into an in-phase (I) signal and a quadrature-phase (Q) signal;
   multiplication units configured to multiply the converted I and Q signals by orthogonal sequences, respectively;
   conversion units configured to Hilbert-transform the I and Q signals multiplied by the orthogonal sequences;
   addition units configured to add the I and Q signals multiplied by the orthogonal sequences and the Hilbert-transformed Q and I signal, respectively; and
   an intermediate frequency (IF)/radio frequency (RF) unit configured to up-convert the added I signal and the added Q signal and transmit the converted I and Q signals.

2. The transmitter of claim 1, wherein the added I signal and the added Q signal are signals obtained by modulating the I and Q signals of the data through a vestigial sideband (VSB)/single sideband (SSB) modulation scheme.

3. The transmitter of claim 1, wherein the S/P conversion unit transmits the data inputted in a serial form into data paths corresponding to the I and Q signals, respectively.

4. The transmitter of claim 1, wherein the multiplication units comprise:
   a first multiplication unit configured to multiply the converted I signal by a first orthogonal sequence; and
   a second multiplication unit configured to multiply the converted Q signal by a second orthogonal sequence.

5. The transmitter of claim 4, wherein the conversion units comprise:
- a first conversion unit configured to Hilbert-transform the I signal multiplied by the first orthogonal sequence; and
- a second conversion unit configured to Hilbert-transform the Q signal multiplied by the second orthogonal sequence.

6. The transmitter of claim 5, wherein the addition units comprise:
- a first addition unit configured to add the I signal multiplied by the first orthogonal sequence and the Hilbert-transformed Q signal and output the I signal modulated through a vestigial sideband (VSB)/single sideband (SSB) modulation scheme; and
- a second addition unit configured to add the Q signal multiplied by the second orthogonal sequence and the Hilbert-transformed I signal and output the Q signal modulated through the VSB/SSB modulation scheme.

7. The transmitter of claim 1, wherein the IF/RF frequency unit converts the added I signal and the added Q signal from a baseband into IF and RF bands.

8. The transmitter of claim 1, wherein the orthogonal sequences are Hadamard sequences.

9. A receiver for receiving data in a communication system, comprising:
- an RF/IF unit configured to receive I and Q signals of data and down-convert the received I and Q signals;
- conversion units configured to Hilbert-transform the down-converted I and Q signals;
- addition units configured to add the down-converted I and Q signals and the Hilbert-transformed Q and I signals, respectively;
- multiplication units configured to multiply the added I signal and the added Q signal by orthogonal sequences, respectively; and
- a serial/parallel conversion unit configured to convert the I and Q signals multiplied by the orthogonal sequences and restore the data.

10. The receiver of claim 9, wherein the received I and Q signals are signals obtained by modulating the I and Q signals of the data through a VSB/SSB modulation scheme.

11. The receiver of claim 9, wherein the RF/IF unit converts the received I and Q signals from RF and IF bands into a baseband.

12. The receiver of claim 9, wherein the conversion units comprise:
- a first conversion unit configured to Hilbert-transform the down-converted I signal; and
- a second conversion unit configured to Hilbert-transform the down-converted Q signal.

13. The receiver of claim 12, wherein the addition units comprise:
- a first addition unit configured to add the down-converted I signal and the Hilbert-transformed Q signal; and
- a second addition unit configured to add the down-converted Q signal and the Hilbert-transformed I signal.

14. The receiver of claim 13, wherein the multiplication units comprise:
- a first multiplication unit configured to multiply the added I signal by a first orthogonal sequence; and
- a second multiplication unit configured to multiply the added Q signal by a second orthogonal sequence.

15. The receiver of claim 9, wherein the P/S conversion unit receives the I and Q signals multiplied by the orthogonal sequences from data paths corresponding to the I and Q signals, respectively, and outputs the I and Q signals multiplied by the orthogonal sequences as the restored data in a serial form.

16. The receiver of claim 9, wherein the orthogonal sequences are Hadamard sequences.

17. A data transmission method in a communication system, comprising:
- converting serial data into parallel I and Q signals, and orthogonalizing the I and Q signals by multiplying the converted I and Q signals by orthogonal Hadamard sequences, respectively;
- modulating the orthogonalized I and Q signals through a vestigial sideband (VSB)/single sideband (SSB) modulation scheme; and
- up-converting the modulated I and Q signals from a baseband into IF and RF bands, and transmitting the converted I and Q signals.

18. The data transmission method of claim 17, wherein said modulating the orthogonalized I and Q signals through the VSB/SSB modulation scheme comprises:
- Hilbert-transforming the orthogonalized Q signal, and adding the orthogonalized I signal and the Hilbert-transformed Q signal; and
- Hilbert-transforming the orthogonalized I signal, and adding the orthogonalized Q signal and the Hilbert-transformed I signal.

19. A data reception method in a communication system, comprising:
- receiving I and Q signals of data, and down-converting the received I and Q signals from RF and IF bands into a baseband;
- demodulating the down-converted I and Q signals through a demodulation scheme corresponding to a vestigial sideband (VSB)/single sideband (SSB) modulation scheme;
- multiplying the demodulated I and Q signals by orthogonal Hadamard sequences, respectively, to restore the I and Q signals of the data; and
- converting the restored I and Q signals from a parallel form into a serial form to restore the data.

20. The data reception method of claim 19, wherein said demodulating the down-converted I and Q signals through the demodulation scheme corresponding to the VSB/SSB modulation scheme comprises:
- Hilbert-transforming the down-converted Q signal, and adding the down-converted I signal and the Hilbert-converted Q signal; and
- Hilbert-transforming the down-converted I signal, and adding the down-converted Q signal and the Hilbert-converted I signal.

* * * * *